United States Patent
Low

(10) Patent No.: US 9,351,407 B1
(45) Date of Patent: May 24, 2016

(54) METHOD FOR FORMING MULTILAYER DEVICE HAVING SOLDER FILLED VIA CONNECTION

(71) Applicant: Boon Yew Low, Petaling Jaya (MY)

(72) Inventor: Boon Yew Low, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/591,933

(22) Filed: Jan. 8, 2015

(51) Int. Cl.
| | | |
|---|---|---|
| *H01K 3/10* | (2006.01) | |
| *H05K 3/40* | (2006.01) | |
| *H05K 1/02* | (2006.01) | |
| *H05K 1/11* | (2006.01) | |
| *H05K 3/46* | (2006.01) | |

(52) U.S. Cl.
CPC ............ *H05K 3/4038* (2013.01); *H05K 1/0298* (2013.01); *H05K 1/115* (2013.01); *H05K 3/4644* (2013.01); *H05K 2201/0195* (2013.01); *H05K 2201/083* (2013.01); *H05K 2201/09563* (2013.01); *Y10T 29/49165* (2015.01)

(58) Field of Classification Search
CPC . H05K 3/0055; H05K 3/4053; H05K 3/4069; H05K 2201/083; H05K 2201/09563; H05K 2201/0195; H05K 3/4038; H05K 3/4644; H05K 1/0298; H05K 1/115; H01L 21/00; H01L 21/76898; Y10T 29/49128; Y10T 29/49155; Y10T 29/49163; Y10T 29/49165
USPC ............ 29/830, 831, 846, 851, 852; 174/262, 174/263; 427/97.2
See application file for complete search history.

(56) References Cited

U.S. PATENT DOCUMENTS

| | | | |
|---|---|---|---|
| 4,919,970 A | 4/1990 | Hoebener | |
| 5,191,709 A * | 3/1993 | Kawakami | H05K 3/4053 29/852 |
| 5,275,330 A | 1/1994 | Isaacs et al. | |
| 5,638,598 A * | 6/1997 | Nakaso | H05K 3/0055 29/852 |
| 5,736,074 A | 4/1998 | Hayes et al. | |
| 6,300,578 B1 | 10/2001 | Hoffmeyer | |
| 6,555,761 B2 | 4/2003 | Amir | |
| 2009/0083977 A1* | 4/2009 | Hanke | H01L 21/76898 29/852 |

FOREIGN PATENT DOCUMENTS

WO      2013141166      9/2013

* cited by examiner

*Primary Examiner* — Donghai D Nguyen
(74) *Attorney, Agent, or Firm* — Charles E. Bergere

(57) ABSTRACT

A method of forming a multilayer device includes providing a core substrate having opposing first and second core surfaces and forming top and bottom inner conductive patterns on each of the first and second core surfaces, respectively. A first dielectric layer is formed on the first core surface, and the top inner conductive pattern. A second dielectric layer is formed on the second core surface, and the bottom inner conductive pattern. The first and second dielectric layers are laminated with top and bottom outer conductive layers, respectively. A first via is provided through the core substrate extending from the top outer conductive layer to the bottom outer conductive layer. The first via is filled with solder. Magnetic particles are attracted by a magnetic force into the first via.

5 Claims, 4 Drawing Sheets

METHOD FOR FORMING MULTILAYER DEVICE HAVING SOLDER FILLED VIA CONNECTION

BACKGROUND OF THE INVENTION

The present invention is directed to printed circuit boards or substrates, and, more particularly, to a via within a printed circuit board or substrate filled with solder.

Electronic components are typically assembled into complex circuits by mounting them on multilayer devices, such as printed circuit boards (PCBs) and/or multilayer substrates. Multiple layers that serve to electrically connect one or more electronic components to other electronic components attached to a different layer or the layers themselves, must be electrically connected to each other at selected points, requiring use of what is commonly known as a via, which is formed as a cylindrical hole in one or more layers of the substrate or printed circuit board. To electrically interconnect various electronic components and/or layers to one another, a wall of the via or hole is plated, by a plating process, with a conducting material, such as copper, aluminum, gold, or silver and subsequently filled with a material, such as via plug resin, solder resist, or solder materials.

Unfortunately, the conventional plating and via filling processes are time consuming, costly, and can have significant defects. For example, the via plating process can create cavities or "voids" between a conductive layer and non-conducting layers, which can become sites for chemical contamination and corrosion, thus interfering with the conductivity of the layers. Other defects that may occur during manufacturing include improper via filling, high via stress, and plated via cracking, which may potentially cause failure of the multilayer device, and create long term reliability issues.

It is therefore desirable to provide a method for manufacturing a semiconductor device with a solder filled via in a manner that is not susceptible to the plating and other possible defects that may occur using conventional via filling processes.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

Figure 1:
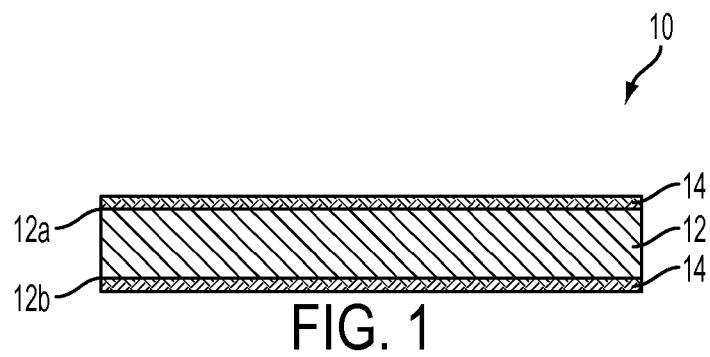
FIG. 1 is a cross-sectional side elevational view of a core substrate of a multilayer device laminated with top and bottom inner conductive layers in accordance with a preferred embodiment of the present invention.

In one embodiment, the present invention provides a method of forming a semiconductor device. The method includes providing a core substrate having opposing first and second core surfaces; forming a top and a bottom inner conductive pattern on each of the first and second core surfaces, respectively; forming a first dielectric layer on at least a portion of the first core surface and the top inner conductive pattern; forming a second dielectric layer on at least a portion of the second core surface and the bottom inner conductive pattern; laminating the first and second dielectric layers with top and bottom outer conductive layers, respectively; providing a first via through the core substrate extending from the top outer conductive layer to the bottom outer conductive layer; at least partially filling the first via with solder; and attracting, by a magnetic force, at least one magnetic particle into the first via.

In another embodiment, the present invention provides a method of forming a semiconductor device. The method includes providing a core substrate having opposing first and second core surfaces; forming a top and a bottom inner conductive pattern on each of the first and second core surfaces, respectively; forming a first dielectric layer on at least portion of the first core surface, and the top inner conductive pattern; forming a second dielectric layer on at least a portion of the second core surface, and the bottom inner conductive pattern; laminating the first and second dielectric layers with top and bottom outer conductive layers, respectively; providing a first via through the core substrate extending from the top outer conductive layer to the bottom outer conductive layer; and attracting, by a magnetic force, at least one solder coated magnetic particle into the first via.

Referring to the drawings, wherein the same reference numerals are used to designate the same components throughout the several figures, there is shown in FIGS. 1-9 preferred embodiments of a method for manufacturing a multilayer device 10 (e.g., a printed circuit board or substrate) in accordance with the invention.

Referring to FIG. 1, a core substrate 12 is provided and an inner conductive layer 14 is preferably secured or laminated on first and second primary or principal surfaces 12a, 12b of the core substrate 12 using a process known in the art. The core substrate 12 is preferably made of a glass fiber reinforced thermosetting resin but could be made of some other suitable material or combination of materials. The inner conductive layers 14 may be constructed from any conductive material, but are preferably comprised of copper.

Figure 2:
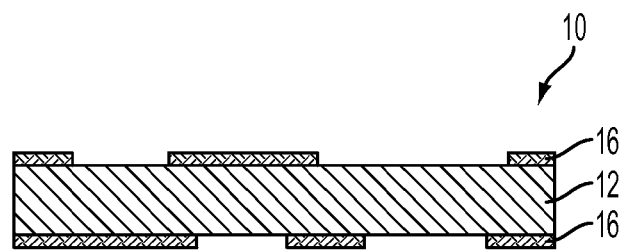
FIG. 2 is a cross-sectional side elevational view of the core substrate of FIG. 1 following the formation of top and bottom inner conductive patterns from the inner conductive layers in accordance with a preferred embodiment of the present invention.

Referring to FIG. 2, an inner conductive pattern(s) 16 is preferably formed from one or both of the inner conductive layers 14. The inner conductive pattern(s) 16 may be formed using a conventional lithographic process, such as a subtractive process, to remove portions of the conductive material on copper from one or both of the first and second conductive layers 14. Such a subtractive process can include photoengraving, which uses a photomask and developer to selectively remove a photoresist coating. The remaining photoresist protects the inner conductive layers 14, and a subsequent etching removes the unwanted material or copper from the inner conductive layers 14. Both inner conductive patterns 16 may be different as shown in FIG. 2 or they may be the same (not shown).

Figure 3:
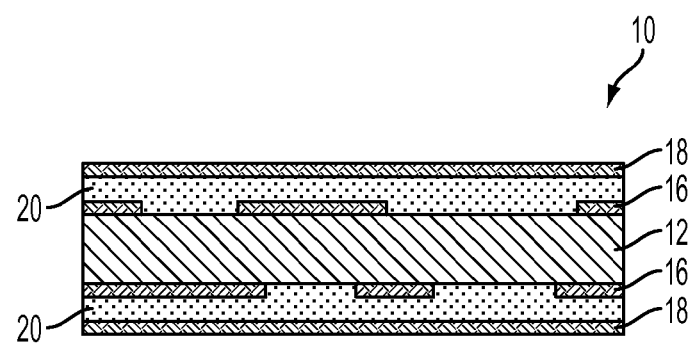
FIG. 3 is a cross-sectional side elevational view of the core substrate of FIG. 2 following the formation of first and second dielectric layers, and top and bottom outer conductive layers in accordance with a preferred embodiment of the present invention.

Next, as shown in FIG. 3, the inner conductive patterns 16 are preferably laminated with an outer conductive layer 18 (also preferably including copper material) with a dielectric layer 20 positioned therebetween. Such dielectric layers 20 serve to insulate layers of conductive traces (e.g., conductive patterns), such as the inner conductive patterns 16 and the outer conductive layers 18. Such dielectric layers 20 can be a pre-preg layer, which can be any type of pre-impregnated composite fibers where a material, such as epoxy is already present as used for printed circuit boards. For example, the pre-preg layer can take the form of a weave or may be unidirectional. In addition, the pre-preg layer can contain an amount of the matrix material used to bond them together and to other components during manufacture.

Figure 4:
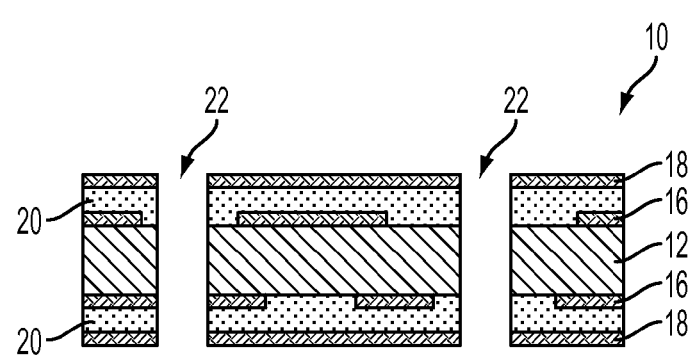
FIG. 4 is a cross-sectional side elevational view of the multilayer device of FIG. 3 following the drilling of the vias, in accordance with a preferred embodiment of the present invention.

Now referring to FIG. 4, through hole vias 22 are preferably drilled, which extend from a top surface of the device 10 (top outer conductive layer 18) through all layers of the device 10 to a bottom surface of the device 10 to a bottom surface of the device 10 (bottom outer conductive layer 18). Such through hole vias 22 can be formed by a mechanical drill using a cutting blade, or a laser drill using a laser or in any other known manner. As shown two via holes 22 are formed. However, any number of via holes 22 can be formed in still keeping with the spirit of the invention. Further, the via holes may extend though only some or one of the layers as described hereinthroughout.

Figure 5:
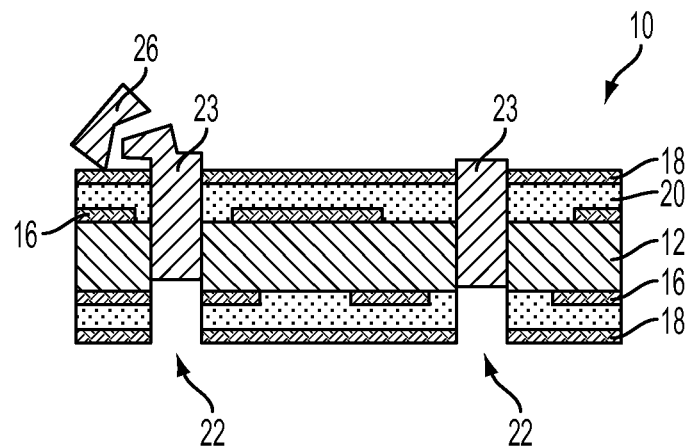
FIG. 5 is a cross-sectional side elevational view of the multilayer device of FIG. 4 following the installation of solder into a portion of the vias, in accordance with a preferred embodiment of the present invention.

In FIG. 5, solder paste 23 is installed, preferably screen printed into the via holes 22 so as to at least partially (e.g., preferably at least halfway) fill the via holes 22 with the solder paste 23. If the solder paste 23 is installed using screen printing, a squeegee 26 may be used. The solder paste 23 can comprise a conventional solder alloy, such as 95% Pb/5% Sn, 60% Pb/40% Sn, 63% Sn/37% Pb, 62% Pb/36% Sn/2% Ag, or the like. It should be noted that other methods can be used to insert the solder paste 23 into the via holes 22. For example, the solder paste 23 can be inserted into the via holes 22 through the use of a pressure head, jetting, or with a syringe or nozzle type device inserted into the via in still keeping with the spirit of the invention.

Figure 6:
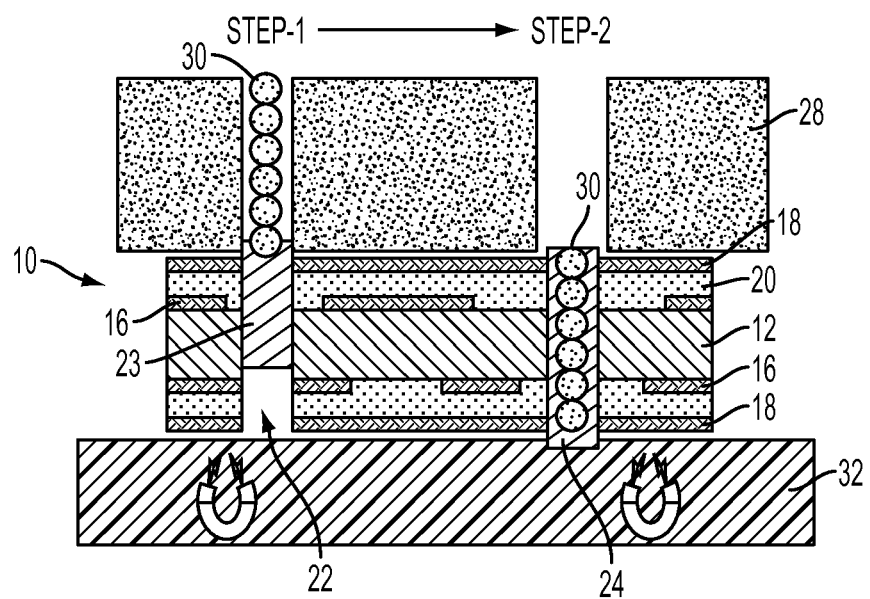
FIG. 6 is a cross-sectional side elevational view of the multilayer device of FIG. 5 illustrating steps for attracting magnetic particles into the at least partially filled vias at least partially filled, in accordance with a preferred embodiment of the present invention.

Referring now to FIG. 6, at Step 1, a stencil 28 is preferably filled with one or more magnetic particles or spheres 30, and is positioned over the upper outer conductive layer 18 so that the magnetic spheres 30 within the stencil 28 are aligned with the via holes 22 to be filled. A magnetized block 32, such as a magnetized table top, on which the device 10 rests, pulls (at Step 2), the magnetic spheres 30 from the stencil 28 into the via holes 22 by the action of a magnetic force from the magnetized block 32, so as to ensure the entirety of each of the via holes 22 is filled. An electromagnet (not shown) or another device suitable for providing a magnetic field may alternatively be used. A thermal reflow process is performed to melt the solder paste 23 so as to ensure full contact with interior walls of the via holes 22. Consequently, each of the via holes 22, now filled with magnetic spheres 30 coated with solder 24, form an electrical connection between the top and bottom outer conductive layers 18.

Figure 7A:
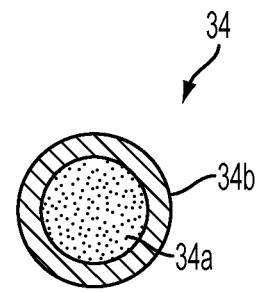
FIG. 7A is a cross-sectional view of a solder coated magnetic sphere, in accordance with a preferred embodiment of the present invention.
Figure 7B:
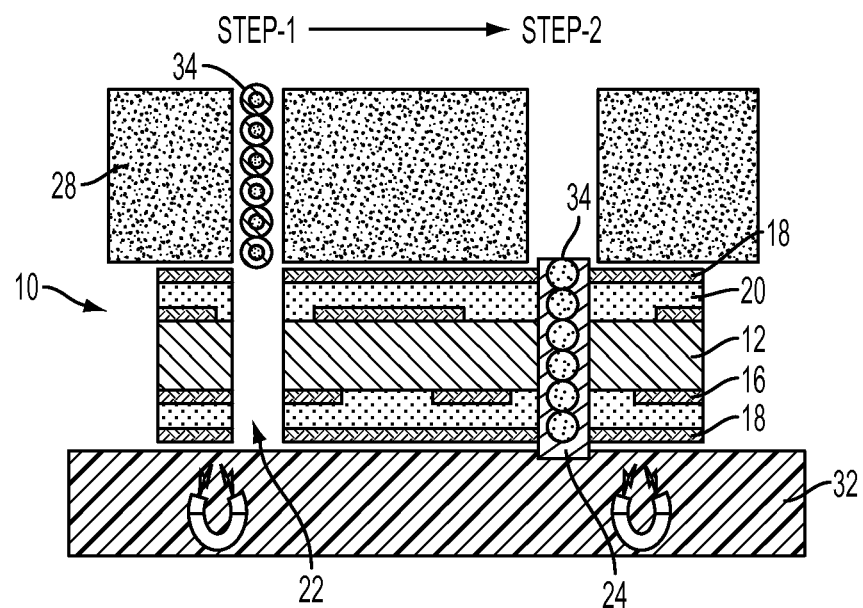
FIG. 7B is a cross-sectional side elevational view of the multilayer device of FIG. 4 illustrating steps for attracting the solder coated magnetic spheres into the vias, in accordance with a preferred embodiment of the present invention.

In another embodiment (e.g., as an alternative to the steps described in connection to FIG. 6 above), referring now to FIGS. 7A and 7B, at Step 1, the stencil 28 is preferably filled with solder coated magnetic spheres 34, a cross section of which is shown in FIG. 7A. In the present embodiment, it should be noted the step shown in FIG. 5 is skipped. As such, no solder 24 or solder paste 23 is initially installed within the vias. As best seen in FIG. 7A, the solder coated magnetic sphere 34 includes a magnetic core 34a, coated with a solder outer layer 34b. The magnetic core 34a comprises a magnetic material such as iron, scrap carbide, nickel, cobalt, magnetic stainless steel, or the like. The magnetic core 34a can be formed using techniques that are known in the art.

At Step 2, the magnetized block 32, such as the magnetized table top on which the device 10 rests (or other device suitable for providing a magnetic field), pulls the solder coated magnetic spheres 34 into the via holes 22 by the action of the magnetic force from the magnetized block 32, so as to ensure that the openings of the via holes 22 are filled. A thermal reflow process is performed to melt the solder 34b so as to ensure full contact with the interior surfaces of the walls of the via holes 22. Consequently, each of the via holes 22, now filled with solder coated magnetic spheres 34, forms an electrical connection between the top and bottom copper layers 18.

According to another embodiment of the present invention, particular via(s) can be selected to be filled with one or more, or none of the above described materials, such as the magnetic spheres 30 coated with solder 34b. More specifically, the device 10 can be masked with the stencil 28 to permit selective filling of one or more of the vias 22 and not others.

Although the solder coated magnetic particles or cores are generally described herein as solder coated magnetic spheres 34a, it is to be understood that the solder coated magnetic particles may be in shapes other than spherical. The scope and spirit of the present invention is not limited to spherical shaped magnetic material, but is intended to encompass other shapes as well.

Figure 8:
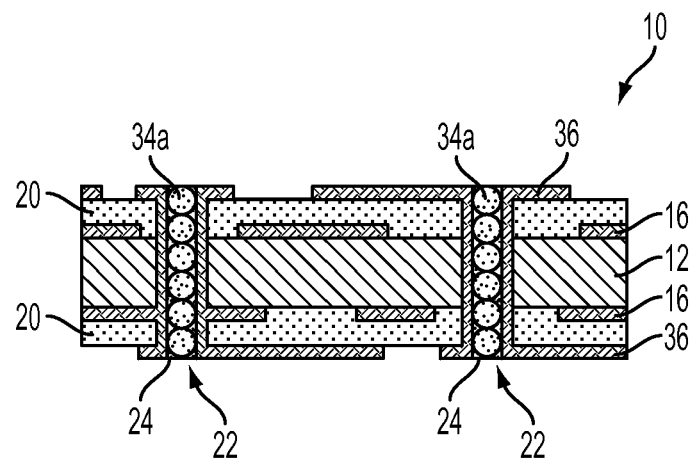
FIG. 8 is a cross-sectional side elevational view of the multilayer device of FIG. 6 following installation of the solder coated magnetic spheres and formation of an outer layer pattern on the top and bottom outer conductive layers in accordance with a preferred embodiment of the present invention.

Referring now to FIG. 8, an outer conductive pattern 36 is preferably formed from one or both of the top and bottom outer conductive layers 18. The outer conductive layer pattern(s) 36 may be formed using a conventional lithographic process, such as that described above with respect to the formation of the inner conductive pattern(s) 16.

Figure 9:
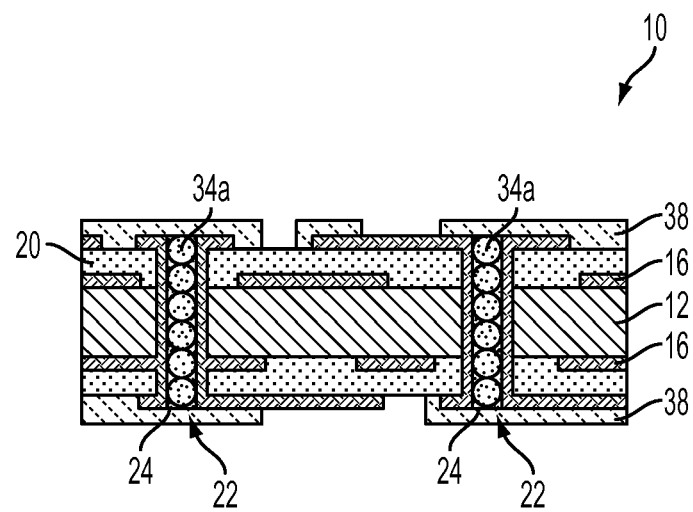
FIG. 9 is a cross-sectional side elevational view of the multilayer device of FIG. 8 following formation of a solder resist layer in accordance with a preferred embodiment of the present invention.

As shown in FIG. 9, a solder resist layer 38 is preferably formed on one or both of the outer conductor pattern(s) 36 and potentially an exposed portion of the dielectric layer(s) 20. Such solder resist layer 38 serves to protect the outer conductive pattern(s) 36 exposed at the surface of the device 10 and also functions as a dam for preventing solder flowing and solder bridging of a solder body (for example, a solder bump)

supplied onto surfaces of pads (not shown) to be mounted with an electronic component (not shown).

As shown in FIG. 9, the device 10 includes two through hole vias 22 filled with solder 24 containing magnetic spheres 30. However, it should be noted that the multilayer device 10 may contain fewer or more layers as well as other types of vias as well, such as blind vias, through vias, and the like. For example, blind vias extend from a surface of the device through a portion of one or more of the dielectric layers 20 of the device 10. Buried vias may be provided through the core substrate 12 and a portion of one or more of the dielectric layers 20, but not through an outer layer surface 38 of the device 10.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and with the exception of expressly ordered steps, the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method for forming a multilayer device, the method comprising:
    providing a core substrate having opposing first and second core surfaces;
    forming a top and a bottom inner conductive pattern on each of the first and second core surfaces, respectively;
    forming a first dielectric layer on at least a portion of the first core surface, and the top inner conductive pattern;
    forming a second dielectric layer on at least a portion of the second core surface, and the bottom inner conductive pattern;
    laminating the first and second dielectric layers with top and bottom outer conductive layers, respectively;
    providing a first via through the core substrate, wherein the first via extending from the top outer conductive layer to the bottom outer conductive layer; and
    attracting, by a magnetic force, at least one solder coated magnetic particle into the first via.

2. The method of claim 1, further comprising: prior to the attracting, filling a stencil with the at least one solder coated magnetic particle.

3. The method of claim 1, further comprising melting the solder within the first via.

4. The method of claim 1, further comprising masking the device with a stencil to permit selective filling of the first via.

5. The method of claim 1, wherein the at least one solder coated magnetic particle includes at least one magnetic particle comprising at least one of iron, scrap carbide, nickel, cobalt, or magnetic stainless steel.

\* \* \* \* \*